United States Patent
Heid

(10) Patent No.: US 6,819,107 B2
(45) Date of Patent: Nov. 16, 2004

(54) MR GRADIENT COIL SYSTEM WITH A SHIM TRAY RECEPTACLE AT A POSITION UNALTERED BY TEMPERATURE CHANGES

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/412,025

(22) Filed: Apr. 11, 2003

(65) Prior Publication Data

US 2003/0218460 A1 Nov. 27, 2003

(30) Foreign Application Priority Data

Apr. 18, 2002 (DE) ........................................ 102 17 384

(51) Int. Cl.[7] ............................................... G01V 3/00
(52) U.S. Cl. ..................................................... 324/318
(58) Field of Search ................................. 324/320, 319, 324/318, 322, 309; 335/216, 296, 297–301

(56) References Cited

U.S. PATENT DOCUMENTS

| 5,278,502 A | 1/1994 | Laskaris et al. ............ 324/318 |
| 5,550,472 A | 8/1996 | Richard et al. ............. 324/320 |
| 5,570,021 A | 10/1996 | Dachniwskyj et al. ...... 324/318 |
| 5,786,695 A | 7/1998 | Amor et al. ................. 324/320 |
| 6,111,412 A | 8/2000 | Boemmel et al. ........... 324/318 |
| 6,172,588 B1 * | 1/2001 | Laskaris et al. ............ 335/299 |
| 6,396,376 B1 * | 5/2002 | Laskaris et al. ............ 335/299 |

FOREIGN PATENT DOCUMENTS

DE    19721985 A1 * 12/1998    ......... G01R/33/385

* cited by examiner

Primary Examiner—Diego Gutierrez
Assistant Examiner—Tiffany A. Fetzner
(74) Attorney, Agent, or Firm—Schiff Hardin LLP

(57) ABSTRACT

A gradient coil system has at least one shim receptacle space for passive shim elements and a decoupling device with which a volume change of components of the gradient coil system caused by a temperature change is mechanically decoupled from the shim receptacle space. The decoupling device is arranged in the gradient coil system so that the shim receptacle space remains unvaried in position relative to a defined point of a volume to be shimmed.

12 Claims, 1 Drawing Sheet

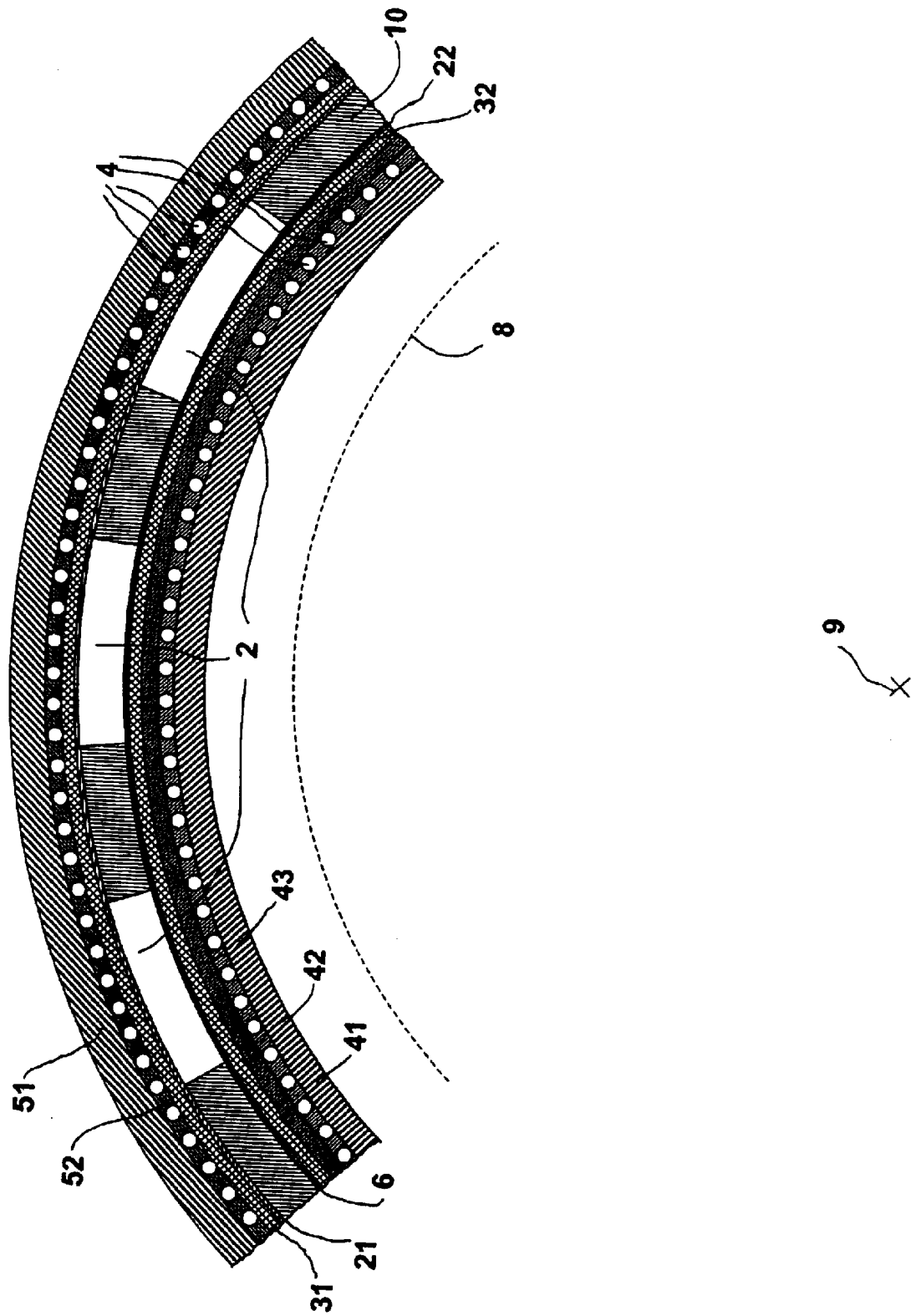

MR GRADIENT COIL SYSTEM WITH A SHIM TRAY RECEPTACLE AT A POSITION UNALTERED BY TEMPERATURE CHANGES

BACKGROUND OF THE INVENTION

1. Field of the Invention

The present invention is directed to a gradient coil system of the type having at least one shim receptacle space for passive shim elements.

2. Description of the Prior Art

Magnetic resonance technology is a known technology for, among other things, acquiring images of the inside of the body of an examination subject. In a magnetic resonance apparatus, rapidly switched gradient fields that are generated by a gradient coil system are superimposed on a static basic magnetic field that is generated by a basic field magnet. The magnetic resonance apparatus also has a radiofrequency system that emits radiofrequency signals into the examination subject for triggering magnetic resonance signals and picks up the magnetic resonance signals, on the basis of which magnetic resonance images are produced.

A high homogeneity of the basic magnetic field is a critical factor for the quality of the magnetic resonance images. Inhomogeneities of the basic magnetic field within a homogeneity volume of the magnetic resonance apparatus cause geometrical distortions of the magnetic resonance image that are proportional to the inhomogeneities. Shim systems are employed for improving the basic magnetic field homogeneity within the homogeneity volume. A distinction is made between passive and active shim systems. In a passive shim system, a number of laminae composed of a magnetic material, particularly a ferromagnetic iron alloy, are attached in the examination space of the magnetic resonance apparatus in a suitable arrangement. To that end, the basic magnetic field is measured within the homogeneity volume before the attachment of the laminae. Using the measured values, a computer program determines the suitable number and arrangement of the laminae.

During operation of the gradient coil system, the amplitudes of the required currents amount to several 100 A in the conductor of the coil. The current rise and decay rates amount to several 100 kA/s. The drive voltage for the coil current amounts to up to several kV. The gradient coil is often cooled for governing the aforementioned, high electrical powers. German OS 197 21 985 and 197 22 211 each disclose a cooling device for the indirect cooling of conductors of the gradient coil. A flexible cooling conduit following a tightly curved path through which a coolant is conducted for cooling the gradient coil is introduced on a cylindrical surface of a hollow-cylinder gradient coil system that is cast with casting resin.

German PS 100 20 264 discloses that a constant temperature of a passive shim system is important for maintaining the constant precision of the shim effect. Without countermeasures, the creation of heat in the current-carrying conductor of the gradient coil leads to a temperature variation and thus to a change in volume of the neighboring, passive shim system. The shim effect thus is no longer optimum and the homogeneity of the basic magnetic field and the quality of magnetic resonance images therefore are degraded. In order to prevent such temperature fluctuations in a passive shim system German PS 100 20 264 discloses designing the conductors of the gradient coil to be coolable and—at the same time—heat insulating the conductor from a carrier structure of the gradient coil system. A high temperature stability thus is achieved for the passive shim system arranged in the carrier structure.

SUMMARY OF THE INVENTION

An object of the present invention is to provide an improved gradient coil system that assures a constantly good shim effect for a passive shim system arranged in the gradient coil system regardless of the operating condition of the gradient coil system.

This object is achieved in accordance with the invention in a gradient coil system having at least one shim receptacle space for passive shim elements, and a decoupling device with which a change in volume of components of the gradient coil system caused by a temperature change is mechanically decoupled from the shim receptacle space and that is arranged such in the gradient coil system that the shim receptacle space remains unvaried in position relative to a defined point of a volume to be shimmed.

The invention is based on the perception that a positional change of a passive shim system arranged in the gradient coil system relative to a defined point of a volume to be shimmed as a consequence of a change in temperature and the change in volume of components of the gradient coil system accompanying the change in temperature, also leads to a degradation of the shim effect, as does the change in temperature of the passive shim system itself, as is known. Cooling of the gradient coils and/or shielding coils of the gradient coil system is incapable of completely preventing such a change in volume, since volume changes propagate across regions of cooling devices in the carrier material of the gradient coil system due to mechanical stresses, so that, for example, the entire gradient coil system lengthens. The decoupling device mechanically decouples temperature change-induced lengthening and compression tendencies of components of the gradient coil system, particularly in regions wherein conductors of gradient coils and/or shielding coils proceed, from shim receptacle spaces of the gradient coil system. A change in position of the passive shim system arranged in the shim receptacle spaces thus is prevented.

DESCRIPTION OF THE DRAWINGS

The single FIGURE is a section through a portion of a gradient coil system constructed in accordance with the principles of the present invention.

DESCRIPTION OF THE PREFERRED EMBODIMENTS

As an exemplary embodiment of the invention, the FIGURE shows a portion of a cross-section through a gradient coil system that is fashioned roughly corresponding to a hollow cylinder. The hollow-cylindrical gradient coil system is subdivided into hollow-cylindrical sub-regions 10 through 52 that are concentric with one another. Shim receptacle spaces 2 that are continuous in the axial direction and have an annular segment-like cross-section are arranged in a central, first sub-region 10. For shimming an imaging volume 8 with a mid-point 9, elements of magnetic material, for example arranged in a correspondingly fashioned shim tray, can be introduced into the shim receptacle spaces 2.

Second sub-regions 21 and 22 are directly adjacent to the first sub-region 10. A supporting unit that has a number of annular fiberglass bands 6 is arranged in the second sub-regions 21 and 22 as component of a decoupling device. The fiberglass bands 6 are distributed in the axial direction. Each of the fiberglass bands 6 proceeds annularly around the point 9. The fiberglass bands 6 have a higher modulus of elasticity than the rest of the gradient coil system.

Two third sub-regions 31 and 32 are directly adjacent to the second sub-regions 21 and 22. The third sub-regions 31 and 32 form a compensation unit that has a comparatively low modulus of elasticity, as a further component of the decoupling device. The third sub-region 32 is followed by further sub-regions 41 through 43. A longitudinal gradient coil is arranged in the sub-region 43, two transverse gradient coils are arranged in the sub-region 41 and cooling channels 4 of a cooling unit for cooling the gradient coils are arranged in the sub-region 42. Further sub-regions 52 and 51 are arranged adjacent to the third sub-region 31. Shielding coils associated with the gradient coils are arranged in the sub-region 51 and cooling channels 4 of a further cooling device are arranged in the sub-region 52 for cooling the shielding coils.

A flow of current in conductors of the gradient and/or shielding coils causes a heating of the further sub-regions 41 through 52 given operation of the gradient coil system, so that those regions expand radially outwardly. The expansion of the sub-regions 41 through 43 is compensated by the sub-regions 22 and 32 by the compensation unit of the sub-region 32 enabling a certain expansion, and—at the same time—the supporting unit of the sub-region 22 converting the expansion into annularly directed tensile and compressive strains that are intercepted by the fiberglass bands 6, so that the shim receptacle spaces 2 respectively remain in unaltered positions relative to the mid-point 9. Thus, the shim effect of shim elements introduced into the shim receptacle spaces 2 remains unmodified. When the conductors cool, the above-described sequence proceeds in the opposite direction, so that the shim receptacle spaces 2 still remain in positions that are unaltered relative to the mid-point 9.

The functioning of the sub-regions 21 and 31 corresponds to that of the sub-regions 22 and 32. The sub-regions 21 and 31 maintain the respective positions of the shim receptacle spaces 2 which otherwise would occur given a volume change of the further sub-regions 51 and 52 caused by temperature variations.

In another embodiment, the gradient coil system is fashioned without the sub-regions 31 and 32, so that the volume changes of the further sub-regions 41 through 52 caused by temperature changes are converted into corresponding tensile and compressive strains only by the sub-regions 21 and 22. This is advantageous particularly given gradient coil systems with moderate electrical power and thus a moderate volume change of the sub-regions 41 through 52 caused by such temperature changes.

In another embodiment, the gradient coil system of the FIGURE can be fashioned as an unshielded gradient coil system, in which case the sub-regions 21, 31, 52 and 51 are not present.

In another embodiment, the conductors of the gradient and/or shielding coils in the gradient coil system of the FIGURE can be fashioned so as to be coolable according to the aforementioned German PS 100 20 264 instead of by the sub-regions 42 and 52.

Although modifications and changes may be suggested by those skilled in the art, it is the intention of the inventor to embody within the patent warranted hereon all changes and modifications as reasonably and properly come within the scope of his contribution to the art.

I claim as my invention:

1. A gradient coil system comprising a plurality of gradient coil system components including a gradient coil, at least some of said gradient coil system components being subject to a change in volume due to a temperature change, all of said gradient coil system components being combined in a unitary assembly defining a shim receptacle space, enclosed within said unitary assembly of said gradient coil system components, wherein said shim receptacle space is adapted to receive a shim element magnetically shimming a shimming volume, and a decoupling device embodied in said unitary assembly and interposed between said at least some of said gradient coil system components in said unitary assembly and said shim receptacle space, said decoupling device mechanically decoupling said shim receptacle space from said volume change of said at least some of said gradient coil system components, said decoupling device being disposed in said unitary assembly relative to said at least some of said gradient coil system components and said decoupling device maintaining said shim receptacle space in an unaltered position relative to a defined point in said shimming volume despite said change in volume.

2. A gradient coil system as claimed in claim 1 wherein said decoupling device comprises a shim receptacle space supporting unit which converts said volume change into mechanical stresses.

3. A gradient coil system as claimed in claim 2 wherein said supporting unit has a higher modulus of elasticity than said at least some of said gradient coil system components.

4. A gradient coil system as claimed in claim 2 wherein said supporting unit comprises at least one annular fiberglass band.

5. A gradient coil system as claimed in claim 1 wherein said decoupling device comprises a compensation unit compensating said volume change of said at least some of said gradient coil system components.

6. A gradient coil system as claimed in claim 5 wherein said compensation unit has a lower modulus of elasticity than said at least some of said gradient coil system components.

7. A gradient coil system as claimed in claim 1 wherein said unitary assembly forms a hollow cylinder, and wherein said gradient coil system components define a plurality of concentric, annular regions of said hollow cylinder.

8. A gradient coil system as claimed in claim 7 wherein said shim receptacle is disposed in one of said annular regions.

9. A gradient coil system as claimed in claim 8 wherein said annular region in which said shim receptacle is disposed is a first of said annular regions, and wherein said decoupling device comprises a supporting unit which converts said volume change into mechanical stresses, said supporting unit being disposed in a second of said annular regions adjacent to said first of said annular regions.

10. A gradient coil system as claimed in claim 9 wherein said decoupling device comprises a compensation unit compensating said volume change of said at least some of said components of said gradient coil system, and wherein said compensation unit is disposed in a third of said regions adjacent to said second of said regions.

11. A gradient coil system as claimed in claim 10 wherein said first, second and third of said annular regions are disposed between two further annular regions of said plurality of concentric annular regions, with a first of said two further annular regions containing a said gradient coil and a second of said two further annular regions containing a shielding coil, said gradient coil and said shielding coil forming said at least some of said gradient coil system components.

12. A gradient coil system as claimed in claim 11 further comprising a cooling unit cooling one of said gradient coil and said shielding coil, said cooling unit disposed in one of said two further annular regions.

* * * * *